United States Patent [19]

Hwang

[11] Patent Number: 5,576,226
[45] Date of Patent: Nov. 19, 1996

[54] METHOD OF FABRICATING MEMORY DEVICE USING A HALOGEN IMPLANT

[75] Inventor: Hyun S. Hwang, Seoul, Rep. of Korea

[73] Assignee: LG Semicon Co., Ltd., Seoul, Rep. of Korea

[21] Appl. No.: 245,744

[22] Filed: May 17, 1994

[30] Foreign Application Priority Data

Apr. 21, 1994 [KR] Rep. of Korea .................... 8466/1994

[51] Int. Cl.$^6$ ...................... H01L 21/31; H01L 21/8239
[52] U.S. Cl. .................. 437/24; 437/52; 437/58; 437/979; 437/238; 148/DIG. 163; 148/DIG. 116; 148/DIG. 117
[58] Field of Search ............................. 437/24, 979, 88, 437/238, 52, 940, 58, 45; 148/DIG. 163, DIG. 116, DIG. 117

[56] References Cited

U.S. PATENT DOCUMENTS

| | | | |
|---|---|---|---|
| 4,240,096 | 12/1980 | Hiraki et al. | |
| 4,420,872 | 12/1983 | Solo de Zalvidav | 437/24 |
| 4,627,153 | 12/1986 | Masuoka | 437/52 |
| 4,651,406 | 3/1987 | Shimizu et al. | 437/52 |
| 4,669,178 | 6/1987 | Johnson | 437/238 |
| 4,743,563 | 5/1988 | Pfiester et al. | 437/24 |
| 4,748,131 | 5/1988 | Zietlow | 437/24 |
| 4,748,134 | 5/1988 | Holland et al. | 437/62 |
| 4,920,076 | 4/1990 | Holland et al. | 437/24 |
| 5,057,449 | 10/1991 | Lowrey et al. | 148/DIG. 163 |
| 5,106,768 | 3/1992 | Kuo | 437/34 |
| 5,108,935 | 4/1992 | Rodder | 437/24 |
| 5,215,934 | 6/1993 | Tzeng | 148/DIG. 117 |
| 5,254,489 | 10/1993 | Nakata | 437/40 |
| 5,330,920 | 7/1994 | Soleimani et al. | 148/DIG. 163 |
| 5,358,894 | 10/1994 | Fazan et al. | 437/70 |
| 5,372,951 | 12/1994 | Anjum et al. | 437/24 |
| 5,426,065 | 6/1995 | Chan et al. | 437/52 |
| 5,432,114 | 7/1995 | O | 437/56 |

FOREIGN PATENT DOCUMENTS

| | | | |
|---|---|---|---|
| 242905A | 2/1987 | Germany | 437/979 |
| 54-59074 | 5/1979 | Japan | 437/24 |
| 3-40431 | 2/1991 | Japan | 437/24 |
| 5-275640 | 10/1993 | Japan . | |
| 6-53492 | 2/1994 | Japan . | |

OTHER PUBLICATIONS

Translation of JP 4-100336 (Takeda).
G. Greeuw et al., Sol. St. Electron., 26, 3 (1983) 241 ". . . Silicon By Halogen implantation".
P. J. Wright et al., IEEE Trans. Electron. Dev., 36, 5 (1989) 879 ". . . F in SiO2 Gate Dielectrics", whole paper.
N. Kaasai, et al., IEEE Trans. Electron Dev., 37, 6 (1990) 1426 ". . . F incorporated nMOSFET's".
S. Wolf, "Silicon Processing for the VLSI Era" vol. II, 1992, pp. 572-580.
J. C. Hseih et al., IEEE Electon Dev. Lett., 14 (1993) 222 ". . . BF$_2$ or B implanted poly-Si Gate . . . POCl$_3$. . . ".
P. J. Wright et al., IEEE Trans on Electron Dev., 36 (1989) 879, "F in SiO$_2$ Gate Dielectrics" (Abs. only).

*Primary Examiner*—Charles L. Bowers, Jr.
*Assistant Examiner*—Leon Radomsky
*Attorney, Agent, or Firm*—Morgan, Lewis and Bockius LLP

[57] ABSTRACT

A method of fabricating a memory device for improving the reliability of the cell area and the driving capability of the peripheral area is disclosed, wherein the method comprises the steps of forming a cell area and a peripheral area by forming a field oxidation layer over a first conductive semiconductor substrate, forming gate oxidation layers of the different thickness from each other over a surface of the substrate which corresponds to the cell area and the peripheral area through once oxidation process, forming a gate over the gate oxidation layer, and implanting a second conductive impurity ion into the substrate partly covered with the gates as a mask to form highly-doped source/drain areas in the respective cell and peripheral area, thereby forming respective MOS transistors on each of the cell area and the peripheral area.

4 Claims, 5 Drawing Sheets

METHOD OF FABRICATING MEMORY DEVICE USING A HALOGEN IMPLANT

FIELD OF THE INVENTION

This invention relates to a method of fabricating a memory device, more particularly, to a method of making the memory device having gate oxidation layers, each of gate oxidation layers being formed to the different thickness from each other through once oxidation procedure in the cell area and the peripheral area, resulting in the improved performance and reliability.

BACKGROUND OF THE INVENTION

FIG. 1 is a sectional view of the conventional memory device.

In general, the memory device has a cell area 10-2 and a peripheral area 10-1 which are separated from each other by a field oxidation layer 12.

A gate oxidation layer 13-1 and a gate 14-1 are provided on the peripheral area 10-1 of p type substrate 11, and n+ source/drain region 15-1 is formed near the surface of p type substrate 11 of both sides of the gate 14-1.

The source/drain region 15-1 is connected to a source/drain electrode 17-1 through a contact hole.

A gate oxidation layer 13-2 and a gate 14-2 are provided on the cell area 10-2 of p type substrate 11, and n+ source/drain region 15-2 is formed near the surface of p type substrate 11 of both sides of the gate 14-2.

The source/drain region 15-2 is connected to a source/drain electrode 17-2 through a contact hole.

The reference numeral 16 designates an insulating layer for an insulation between a source/drain electrode 17-1(17-2) and a gate 14-1(14-2) in the peripheral area 10-1(in the cell area 10-2).

It is seen from the above description that the gate oxide layer in the cell area 10-2 has the same thickness as that of the peripheral area 10-1.

Generally, the voltage of 3.3 V is applied to the gate 14-1 in the peripheral area 10-1 and 5.5 V(3.3 V+3 Vt) applied to the gate 14-2 in the cell area 10-2.

Particularly, in DRAM with memory capacities of 64M, very large area of about 0.1 cm2 (0.4×0.35×67.1×10$^6$) within the cell area 10-2 is required for the gate 14-2 and the gate oxidation layer 13-2, and in comparison with said area, a smaller area within the peripheral area 10-1 is required for the gate 14-1 and the gate oxidation layer 13-1.

Though the device geometries are scaled to smaller dimensions below 100 angstrom, the occupied smaller area allows it to be ignored the defect which can be created during the procedure of the gate formation.

However, the reliability of the device is dependent on the cell area of larger area in which high voltage is applied, which results in the difficulty in fabricating the device with the scaling below 100 angstroms.

Also, in case that there are commonly formed the gate oxidation layers of the same thickness in the smaller peripheral area to which low voltage is applied and the larger cell area to which high voltage is applied, MOS transistor of the peripheral area exhibits the features of the reduced driving current and low-speed, and MOS transistor of the cell area has the feature of the reliability degradation.

SUMMARY OF THE INVENTION

The object of this invention is to provide a method of making the memory device having gate oxidation layers, each of gate oxidation layers being formed to the different thickness from each other through once oxidation procedure in the cell area and the peripheral area, resulting in the improved performance and reliability.

According to the object of the invention, a method of fabricating a memory device comprises the steps of forming a cell area and a peripheral area by forming a field oxidation layer over a first conductive semiconductor substrate; coating a photoresist film over a whole surface of the substrate; exposing the surface area of the substrate by removing a part of the photoresist film corresponding to the cell area and leaving other part of the photoresist film corresponding to the peripheral area; implanting a material for faster oxidation into the exposed area of the substrate; exposing the surface area of the substrate by removing the overlying photoresist film on the peripheral area in the substrate; forming gate oxidation layers of the different thickness from each other over a surface of the substrate which corresponds to the cell area and the peripheral area; forming a gate over the gate oxidation layer through the process of the deposition and then patterning of a polysilicon layer; and implanting a second conductive impurity ion into the substrate partly covered with the gates as a mask to form highly-doped source/drain areas in the respective cell and peripheral area, thereby forming respective MOS transistors on each of the cell area and the peripheral area.

DETAILED DESCRIPTION OF THE INVENTION

FIGS. 2A to 2F are sectional views of the process steps explaining a method of fabricating a memory device according to this invention.

Figure 1:
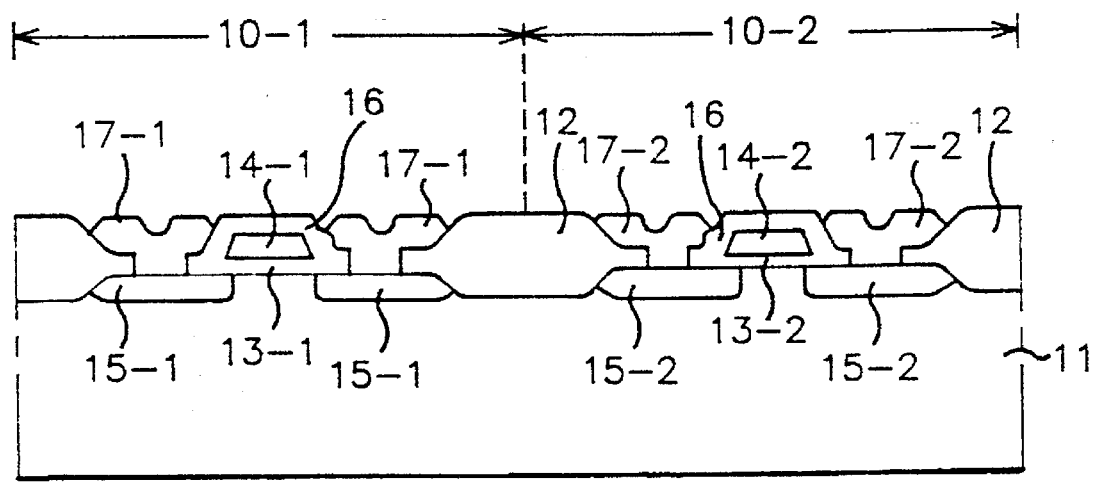
FIG.1 is a sectional view of conventional memory device.
Figure 2A:
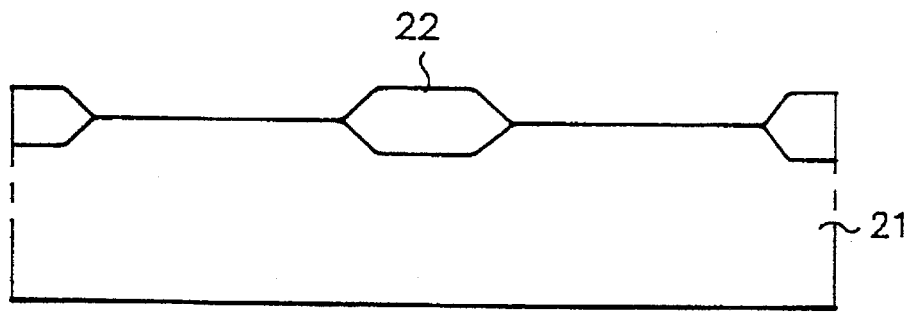
FIGS. 2A to 2F are sectional views of the process steps explaining a method of fabricating a memory device according to the first embodiment of this invention.

FIG. 2A shows p type substrate 21 having a field oxidation layer 22 formed by the well-known field oxidation process, which defines a cell area 20-2 and a peripheral area 20-1. Over the entire surface of the substrate a photoresist film 28 is coated following by the photolithography to leave one part of the photoresist film 28 corresponding to the peripheral area 20-1 over the substrate 21 and to remove other part of the photoresist film 28 corresponding to the cell area 20-2 over the substrate 21.

The above procedure allows it to expose the surface area of the substrate which corresponds to the cell area 20-2.

Figure 2B:
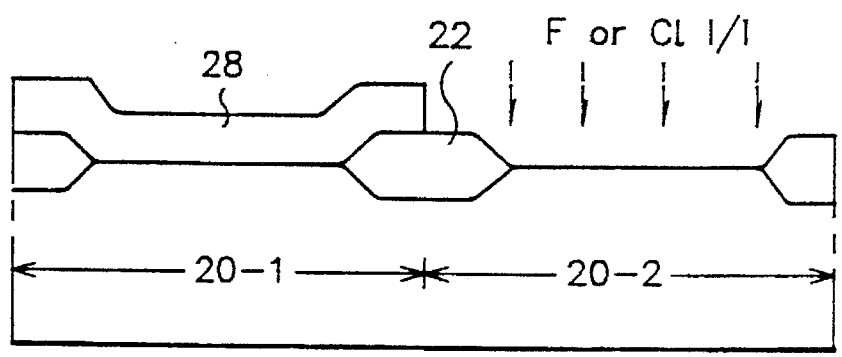

The ionized material suitable for faster oxidation is implanted into the exposed surface area of the substrate 21, wherein a material for faster oxidation comprises the halogens such as F or Cl, which is shown in FIG. 2B.

Figure 2C:
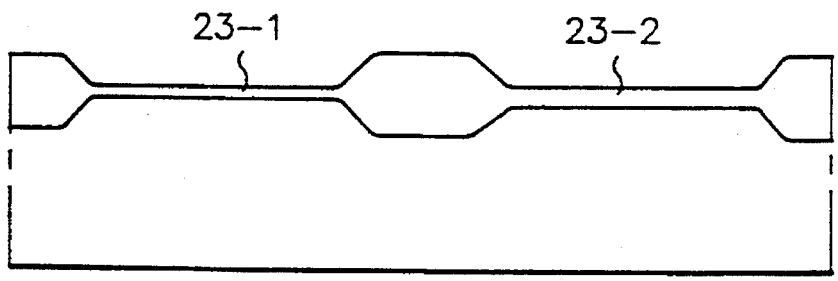

Upon removal of photoresist film 28 residing in the peripheral area 20-1, the oxidation process is carried out to form a gate insulating layer as shown in FIG. 2C.

During oxidation, the implanted halogen material near the surface area of the substrate, which corresponds to the cell area 20-2, acts as the material for faster oxidation by which the oxidation layer in the cell area 20-2 becomes much thicker than that in the peripheral area 20-1, so that the gate oxidation layer in the cell area has a different thickness from that in the peripheral area.

Accordingly, there is provided the thicker gate oxidation layer 23-2 in the cell than that in the peripheral area 20-1, so that the respective thickness of the gate oxidation layers 23-1, 23-2 are different from each other.

Figure 2D:
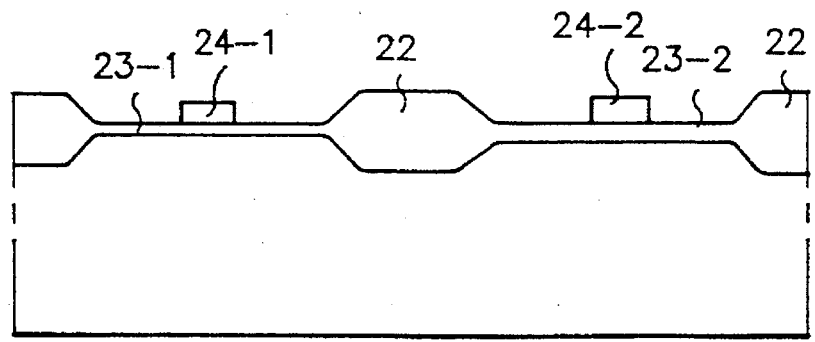

As shown in FIG. 2D, a polysilicon layer is deposited over the whole surface of the substrate and patterned to form gates 24-1, 24-2 which are disposed on gate insulating layers 23-1, 23-2.

Figure 2E:
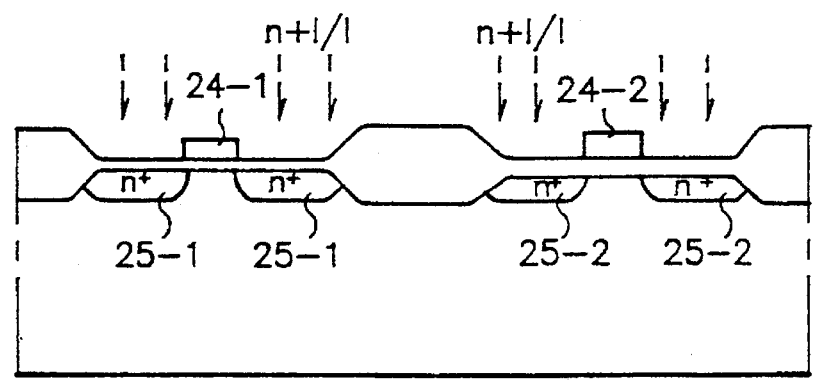

Using gates 24-1, 24-2 as the mask against the ion implantation, as shown in FIG. 2E, n+ type impurity is implanted into the substrate 21 to form n+ source/drain regions 25-1 and 25-2 in the peripheral area 20-1 and cell area 20-2, respectively.

Over the whole surface of the substrate is deposited an insulating layer 26 in which are formed contact holes partially exposing n+ source/drain regions 25-1 and 25-2 of the peripheral area 20-1 and the cell area 20-2, respectively.

Figure 2F:
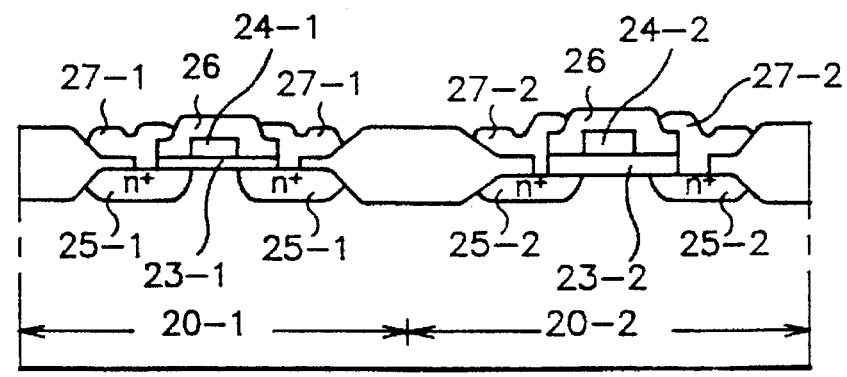

Through the formed contact holes in the insulating layer, the source/drain electrodes 27-1, 27-2 made of the metal are connected to the exposed area of n+ source/drain regions, to complete the respective MOS transistors in the peripheral area 20-1 and the cell area 20-2. Therefore, the required memory device is made as shown in FIG. 2F.

FIGS. 3A to 3F are sectional view of the process steps explaining the method of fabricating a memory device according to the second embodiment of this invention.

Figure 3A:
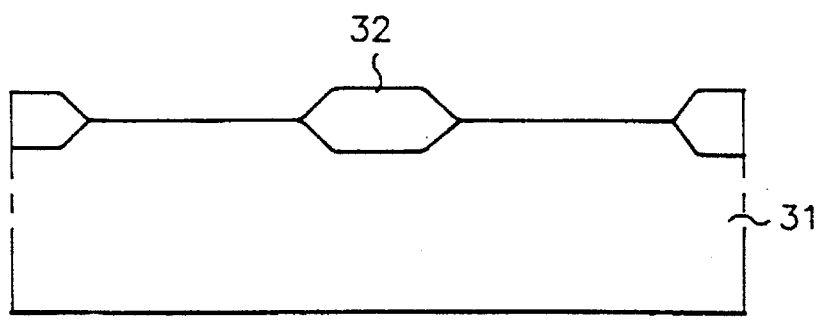
FIGS. 3A to 3F are sectional views of the process steps explaining the method of fabricating a memory device according to the second embodiment of this invention.

FIG. 3A shows p type substrate 31 having a field oxidation layer 32 formed through the well-known field oxidation process, which defines a cell area 30-2 and a peripheral area 30-1.

Over the entire surface of the substrate a photoresist film 38 is coated followed by the photoloithography to leave the photoresist film 38 corresponding to the cell area 30-2 over the substrate 31 and to remove the photoresist film 38 corresponding to the peripheral area 30-1 over the substrate 31.

Figure 3B:
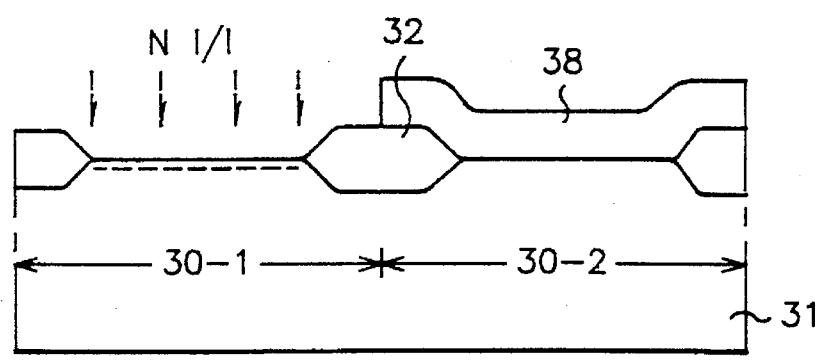
Figure 3C:
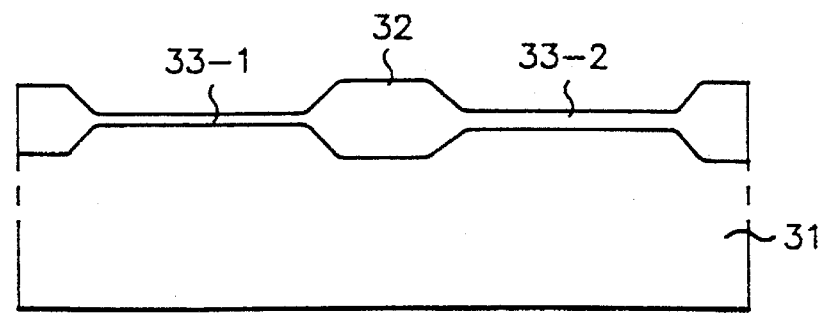

The above procedure allows it to expose the surface of the substrate which corresponds to the peripheral area 30-1. An ionized oxidation retardant is implanted into the exposed surface area of the substrate 31, wherein an oxidation retardant comprises a material of nitrogen, which is shown in FIG. 3B.

Upon removal of photoresist film 38 residing in the cell area 30-2, the oxidation process is carried out to form a gate insulating layer as shown in FIG. 2C.

During oxidizing, the implanted nitrogen material near the surface area of the substrate, which corresponds to the peripheral area 30-1, acts as the oxidation retardant by which the oxidation layer of the peripheral area 30-1 becomes much thinner than in the cell area 30-2.

Accordingly, there is provided the thicker gate oxidation layer 33-2 in the cell area than that in the peripheral area 30-1, so that the thickness of the gate oxidation layers 33-1, 33-2 are different from each other.

Figure 3D:
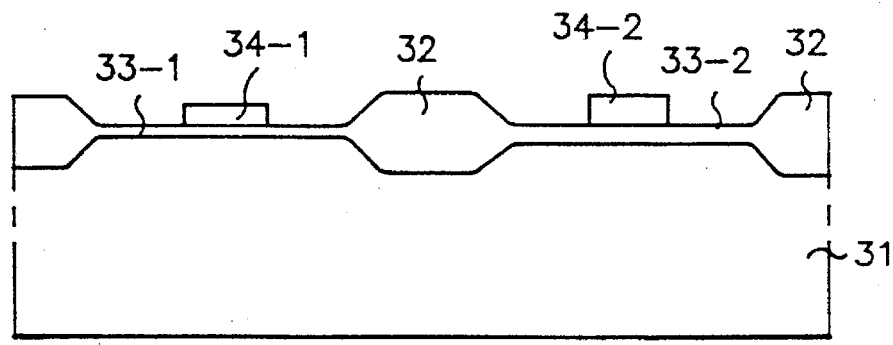

A polysilicon layer is deposited over the whole surface of the substrate and patterned to form gates 34-1, 34-2 which are disposed on the gate insulating layers 33-1, 33-2, as shown in FIG. 3D.

Figure 3E:
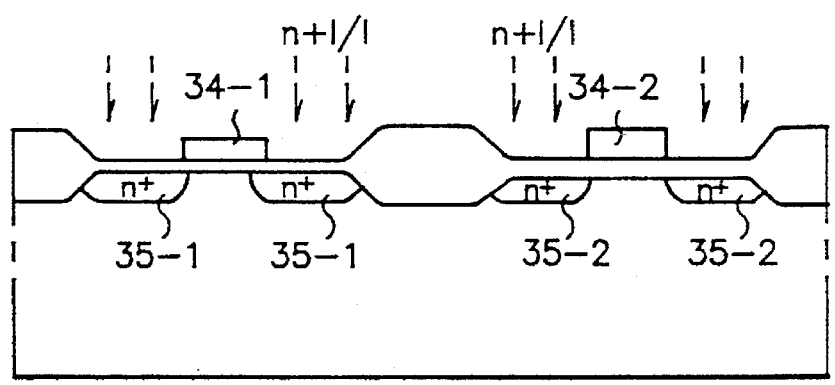

Using the gates 34-1, 34-2 as the mask against the ion implantation, as shown in FIG. 3E, n+ type impurity is implanted into the substrate 31 to form n+ source/drain regions 35-1 and 35-2 in the peripheral area 30-1 and cell area 30-2, respectively.

Over the whole surface of the substrate is deposited an insulating layer 36 in which are formed contact holes that partially expose n+ source/drain regions 35-1 and 35-2 of the peripheral area 30-1 and the cell area 30-2, respectively.

Figure 3F:
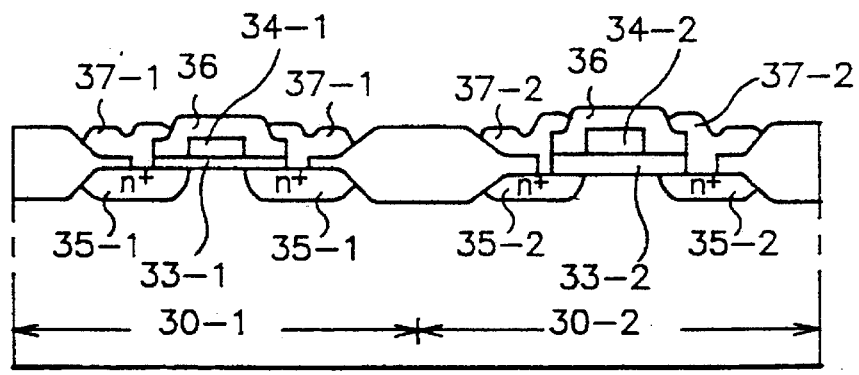

Through the formed contact holes on the insulating layer, source/drain electrodes 37-1, 37-2 made of the metal is connected to the exposed area of n+ source/drain regions, to complete the respective MOS transistors in the peripheral area 30-1 and the cell area 30-2. Therefore the required memory device is made as shown in FIG. 3F.

The first embodiment provides thicker gate oxidation layer 23-2 which is formed through faster oxidation by implanted materials into the cell area 20-2 of the substrate 21, and thinner gate oxidation layer 23-1 in the peripheral area 20-1 as compared with said layer 25-2.

Meanwhile, the second embodiment provides thinner gate oxidation layer 33-1 which is formed implanting the oxidation retardant ion into the peripheral area 30-1 of the substrate 31, and thicker gate oxidation layer 33-2 in the cell area 30-2 as compared with said layer 33-1.

According to the present invention as described above, it is provided that through faster oxidation in the cell area using the halogen it is formed thicker gate oxidation layer in the cell area than that in the peripheral area, alternatively the gate oxidation layer in the peripheral area becomes much thinner than the layer in the cell area such that an oxidation in the peripheral area slowly proceeds by use of a material of nitrogen.

Under the applied low voltage in the peripheral area, the relatively thinner gate oxide layer makes the driving current increase, obtaining high-speed operation thereby, while the relatively thicker gate oxide layer in the cell area makes the defect density reduce, improving the reliability. The yields is thus improved.

There are provided the gate oxidation layer of the different thickness in the cell and peripheral areas, so that the scaling(integrity of the device) is improved through each optimal design of the cell and peripheral areas,

What is claimed is:

1. A method of fabricating a memory device, comprising the steps of:

(a) forming a cell-transistor area and a peripheral area by forming a field oxidation layer over a first conductivity-type semiconductor substrate;

(b) coating a photoresist film over the entire surface of the substrate;

(c) exposing a surface area of the substrate by removing a portion of the photoresist film corresponding to the cell-transistor area and leaving a portion of the photoresist film corresponding to the peripheral area;

(d) implanting a halogen into the exposed area of the substrate;

(e) exposing the surface area of the substrate by removing the overlying photoresist film on the peripheral area;

(f) after step (d), performing an oxidation to form a first gate oxidation layer over a portion of the substrate corresponding to the cell-transistor area and a second gate oxidation layer, which is thinner than the first gate oxidation layer, over a portion of the substrate corresponding to the peripheral area;

(g) forming a first gate over the first gate oxidation layer and a second gate over the second gate oxidation layer by a process of deposition and then patterning of a polysilicon layer; and (h) implanting second conductivity-type ions into the substrate partly covered with the gates as a mask to form highly-doped source/drain areas in the respective cell-transistor and peripheral areas, thereby forming respective MOS transistors on each of the cell-transistor area and the peripheral area.

2. The method according to claim 1, wherein the halogen includes chlorine.

3. The method according to claim 1, wherein step (f) includes the halogen of step (d) causing faster oxidation and thus a thicker oxidation layer being formed an the cell-transistor area than the peripheral area.

4. The method according to claim 1, wherein step (d) includes implanting the halogen using an energy below 50 kev.

* * * * *